United States Patent
Andler et al.

(10) Patent No.: US 6,444,086 B1
(45) Date of Patent: Sep. 3, 2002

(54) DEVICE FOR VACUUM COATING SLIDE BEARINGS

(75) Inventors: Gerd Andler, Frankfurt; Wolfgang Wixwat-Ernst, Wiesbaden; Christoph Metzner, Pappritz; Jens-Peter Heinss, Dresden; Klaus Goedicke, Dresden; Siegfried Schiller, Dresden, all of (DE)

(73) Assignee: Ferderal-Mogul Wiesbaden GmbH & Co. KG, Wiesbaden (DE)

( * ) Notice: Subject to any disclaimer, the term of this patent is extended or adjusted under 35 U.S.C. 154(b) by 0 days.

(21) Appl. No.: 09/555,905

(22) PCT Filed: Nov. 19, 1998

(86) PCT No.: PCT/DE98/03455

§ 371 (c)(1),
(2), (4) Date: Aug. 31, 2000

(87) PCT Pub. No.: WO99/28523

PCT Pub. Date: Jun. 10, 1999

(30) Foreign Application Priority Data

Dec. 3, 1997 (DE) .......................... 197 53 656

(51) Int. Cl.[7] .................. C23F 1/00; C23C 16/509; C23C 16/503; C23C 16/505

(52) U.S. Cl. ............ 156/345.31; 118/719; 118/723 EB; 118/729; 118/726; 156/345.52; 156/345.53; 219/121.15

(58) Field of Search .................. 156/345, 272.2; 204/192.15, 192.38, 192.12; 219/121.12, 121.48; 250/492.23; 315/111.21; 365/174; 378/119; 427/490; 430/322; 118/723 EB, 719, 50; 369/276; 414/331.17, 217; 198/378, 619; 29/25.01

(56) References Cited

U.S. PATENT DOCUMENTS

| 4,072,985 A | * | 2/1978 | Kaganowicz et al. ........ 369/276 |
| 4,643,629 A | * | 2/1987 | Takahashi .............. 414/331.17 |
| 4,674,621 A | * | 6/1987 | Takahashi .................... 198/378 |
| 4,683,149 A | * | 7/1987 | Suzuki et al. ............... 427/528 |
| 4,824,309 A | * | 4/1989 | Kakehi et al. .............. 414/217 |

(List continued on next page.)

FOREIGN PATENT DOCUMENTS

| AT | 392 291 B | 2/1991 |
| DE | 36 06 529 | 9/1987 |
| DE | 37 17 712 A1 | 12/1988 |
| DE | 195 37 092 | 7/1995 |
| DE | 195 14 836 A1 | 10/1998 |
| DE | 197 53 656 | 12/1998 |
| GB | 2 187 207 | 9/1987 |

*Primary Examiner*—Gregory Mills
*Assistant Examiner*—Rudy Zervigan
(74) *Attorney, Agent, or Firm*—Herbert Dubno

(57) ABSTRACT

Existing devices for vacuum coating substrates having different shapes, either in continuous or hatch facilities, are equipped in such a way that several coatings are applied after a coating process. The slide bearings are to be coated with several coats and the coating materials used and the conditions related thereto require the use of several coating techniques. This relates inter alia to conveyance parameters. Existing facilities fail to meet these requirements. According to the invention, such a device comprises several aligned processing chambers. Slide bearings which are held together by positive and non-positive fit in tempered carrier bodies are displaced through said chambers comprising pretreatment, atomization and evaporation chambers using a conveyance system adapted to this process. A tempering device for the carrier bodies is connected upstream from the coating track. Corresponding inlet and outlet channels enable air-to-air conveyance.

16 Claims, 1 Drawing Sheet

U.S. PATENT DOCUMENTS

| | | | |
|---|---|---|---|
| 4,904,362 A | | 2/1990 | Gaertner et al. ........ 204/192.12 |
| 4,911,810 A | * | 3/1990 | Lauro et al. ........... 204/192.12 |
| 5,236,509 A | * | 8/1993 | Sioshansi et al. ........... 118/719 |
| 5,377,816 A | * | 1/1995 | Deligi et al. ................ 198/619 |
| 5,651,867 A | * | 7/1997 | Kokaku et al. ......... 204/298.25 |
| 5,958,134 A | * | 9/1999 | Yaser et al. .................... 118/50 |
| 6,027,618 A | * | 2/2000 | Aruga et al. ........... 204/192.12 |
| 6,099,598 A | * | 8/2000 | Yokoyama et al. ........ 29/25.01 |

\* cited by examiner

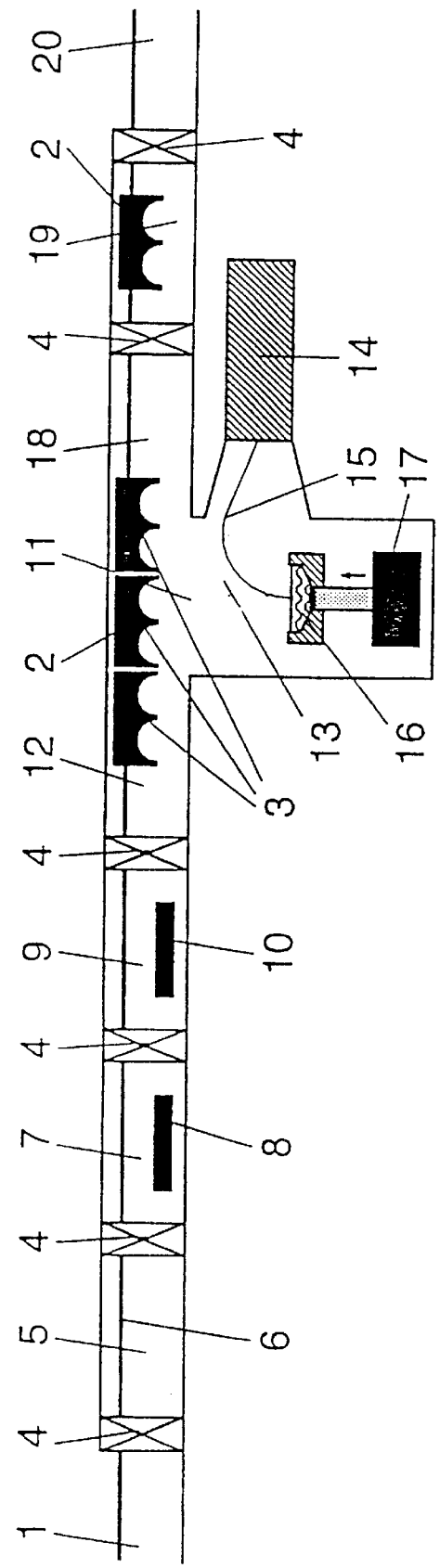

DEVICE FOR VACUUM COATING SLIDE BEARINGS

The invention relates to a device for vacuum coating plain bearings. Plain bearings, also known as bearing shells, comprise concavely-curved surfaces, wherein the inner face associated with the shaft is provided with a multilayer system. Coating is effected in vacuum coating installations. Plain bearings of this type are mainly used under heavy loading in machine and vehicle construction.

Continuous installations for the vacuum coating of substrates have been known for a long time. The substrates may be of various materials and have varying dimensions and geometries, e.g. they may consist of strips, components or glass substrates. One or more layers are applied to these substrates in one pass. To this end, the substrates are introduced into the respective continuous installation via air-locks. Depending on the multilayer system to be applied, pre-treatment is conventionally carried out in an appropriate vacuum chamber, before the corresponding multilayer system is subsequently applied in one or more coating chambers. Once coating is complete, the substrate leaves the continuous installation via an air-lock. The entire multilayer system is applied in such continuous air-to-air installations. The substrates are moved at a virtually constant speed through the installation.

Where flat substrates, such as strips or glass sheets arranged in succession for example, are coated in a continuous installation of this type, it is also known to apply layers which differ in relation to material and thickness with different vacuum coating processes. Thus it is known to atomise two layers onto strips in one pass and then to apply a layer by vapour deposition (Surface and Coatings Technology, 93 (1997) pp. 51–57).

The continuous installation is suitable for strip-form material which is guided through the installation at the same speed even when undergoing different coating processes. However, this installation and the process carried out therewith have the disadvantage of not being suitable for coating substrates whose geometries and layer parameters and layer materials require varying conveying speeds and a variable conveying profile.

A continuous installation is also known for coating turbine blades (DE 195 37 092 C1). In this continuous installation, high temperature-resistant layers are applied to the turbine blades. Application of these layers is effected at high temperatures by electron beam vapour deposition, wherein the turbine blades have to be heated to temperatures of approximately 1000° C. prior to coating. Coating at these temperatures requires highly complex apparatus, which is only warranted for special applications of this type, i.e. turbine blade coating. Coating is carried out by a single method only.

Methods and installations are additionally known for coating plain bearings. As batch installations these generally consist of a vacuum chamber, in which the final overlay is applied by sputtering, after pre-treatment, to a plain bearing which has already been coated. This overlay essentially determines the properties of the plain bearing. Whether the plain bearing fulfils the requirements of it depends on the quality of the overlay applied (DE 36 06 529 C2; AT 392 291 B).

A disadvantage is that, due to the nature of the process, application of the overlay by sputtering involves the input of a large amount of energy into the plain bearing. The temperatures at which the overlay, as a rule a tin-containing material, may be applied are restricted owing to the low melting point of the tin. For this reason, the application of high-quality overlays requires the energy introduced by the process to be reduced to a tolerable level by cooling, e.g. oil cooling. To this end, cooling fluid is supplied to and removed from each support in which the plain bearing is held during atomisation of the layer. Such cooling is unproblematic in batch installations. In contrast, coating of plain bearings in a coating installation of the continuous type, in which several layers are applied in succession under vacuum in vacuum chambers separated by air-locks, conventional fluid-cooling is possible only at great expense.

Another disadvantage of batch installations is that, as a result of magazine operation, they exhibit lower productivity than continuously or virtually continuously operated continuous installations. The lower productivity of batch installations is a consequence of their discontinuous operation and the frequent venting and ventilation of large parts of the installation.

A method for the production of plain bearings has been disclosed, in which the overlay is applied by electron beam vapour deposition. This method enables the overlay of plain bearings to be applied at a higher rate than when atomisation is used and at the same time allows a reduction in the energy input into the plain bearings (DE 195 14 836 A1). However, this method has not yet been applied industrially and at present there is no known installation in which this method may be carried out in relation to plain bearings under industrial conditions.

The object of the invention is to provide a device for vacuum coating plain bearings, with which it is possible to apply several layers of different materials in different thicknesses in highly efficient manner. The device is designed to permit high throughput at low cost. It is intended to ensure compliance with procedurally important parameters within narrow tolerance limits. The temperature of the plain bearing to be coated is to be kept constant within tight limits during the process. The installation is intended to be suitable for carrying out several vacuum processes necessary for the overall process.

The object is achieved according to the invention by the features of claim 1. Further advantageous embodiments are described in claims 2 to 17.

The device, which takes the form of a continuous installation, is constructed in such a way that several vacuum chambers are arranged in succession, wherein there are arranged in each vacuum chamber the means necessary for the process step to be carried out therein. The device further comprises air-lock chambers connected up- and downstream of the vacuum process chambers respectively for introduction and removal of support members. The support members, which are of temperature-controllable design, serve to receive the plain bearings and may be moved through the entire device on a conveying track.

The vacuum chambers and their process-specific means comprise at least one pre-treatment chamber with at least one etching device, a first coating chamber with at least one sputtering source and a second coating chamber with at least one electron beam vaporiser. The vacuum chamber with the electron beam vaporiser is so constructed that a buffer zone is located on each side of the vapour deposition area in the coating chamber.

Essential to the invention is the temperature-controllable construction of the support members or the possibility of controlling the temperature of the plain bearings.

To this end, the support members are so constructed that the plain bearings are accommodated form-fittingly in a part of the support member serving to accommodate them. Good heat transfer from the plain bearings to the support member is achieved by the form-fitting, frictional accommodation of the former. It is thereby ensured that the heat introduced into the plain bearings by the process is transferred into the support member and the plain bearing is prevented from becoming too hot. The dimensions and construction of the part of the support member serving to provide temperature control help mainly to ensure that not only is the introduced heat stored but also the temperature of the plain bearings may be adjusted within a given range. Thus, this construction of the support member ensures that the temperature of the plain bearings during the coating process (sputtering or vapour deposition) is adjusted to a particular value and maintained within narrow limits, i.e. the size, shape and type of material contribute to temperature control on the basis of calculations and tests. A narrow temperature range is absolutely essential in particular in the application of layers which contain low melting point metals if high-quality layers are to be produced. Thus, when for example an AlSn overlay is applied by means of electron beam vapour deposition, the temperature of the plain bearings must be between 140° C. and 160° C. The temperature-controllable construction of the support members plays an essential role in the combination of different coating processes. While cooling elements have conventionally served to dissipate heat, the temperature-controllable support members on the one hand serve to absorb heat, during etching and coating in the first chambers, while on the other hand also serving as heat buffers in the second coating chamber, being in a position to pass heat on to the plain bearings. They thus ensure that the temperature of the plain bearings in the second coating chamber is maintained within a predetermined narrow temperature range. This is a decisive factor, in the case of coating with low melting point metals, in relation to layer quality and thus the quality of the entire plain bearing. Thus, the possibility of establishing different temperatures in the support members for the first time allows layers of different materials to be applied in each case with adequate quality.

Another substantial feature of the invention is the provision of buffer zones. Each coating process has its own time profile, which cannot be applied to any other coating process. Thus, each coating process requires different movement of the plain bearings over the coating source. While etching and sputtering are carried out in stationary and discontinuous manner, thereby requiring only step-wise movement of the support member, electron beam vapour deposition has to be carried out continuously and thus requires different movement conformed to this sub-process. This may in turn be uniform or non-uniform. Furthermore, the residence times in the individual coating chambers are different. By providing buffer zones in conjunction with a control program, it is possible, for the first time, to combine the two different coating processes—discontinuous atomisation and continuous vapour-deposition—in one pass through one device. The provision of buffer zones or buffer chambers is thus an important link, providing a balance between different movement profiles and the completely different operating pressure zones of these two processes, and thus permitting continuous passage of the sliding elements from atmosphere to atmosphere.

Thus, the device according to the invention surprisingly makes it possible, for the first time, highly efficiently to provide plain bearings with several layers in succession under vacuum using different processes in one pass without intermediate exposure to the atmosphere.

In addition to the construction of the support members, advantageous embodiments of the device consist in making the temperature-controllable part of the support member of copper. However, any other materials exhibiting good heat conductivity and a high specific heat capacity are also feasible. The plain bearings may be arranged in the support members next to each other in one or more rows in the conveying direction or at right angles thereto.

The pre-treatment chamber advantageously comprises a gas inlet system, such that plasma-supported processes and even reactive pre-treatments may be carried out. The etching device is provided with a magnetic field or separate plasma sources, e.g. hollow cathodes, may be provided. Any known sputtering source, with or without a magnetic field, may be used as the sputtering source in the first coating chamber. Likewise, any known electron beam source, preferably an axial gun, may be used as the electron beam vaporiser. The vaporiser crucible may take the form of a single- or multi-crucible vaporiser, wherein it is conformed to the geometry of the sliding elements to be coated, in order to achieve homogeneous coating. The vaporisation material may be supplied in the form of wire or bulk material or as a strand through the vaporiser crucible base.

A temperature-control device is advantageously arranged upstream of the inlet-side air-lock chamber. However, it may also be arranged at any desired point in the device or externally thereof. It has merely to be ensured that the plain bearings exhibit a temperature within the set range at the time of application of the overlay. Temperature control may preferably be effected under atmospheric pressure by liquid or gaseous media. The medium is supplied and removed in the known way. It is also possible to arrange corresponding temperature-control elements at the process location in the vacuum, in order to achieve temperature control by contact pressure or application of these temperature-control elements. It is particularly expedient to arrange an additional temperature-control device downstream of the discharge station to cool the support members. All the vacuum chambers may be evacuated by vacuum pumps. A control and monitoring system ensures that the process happens in the correct sequence, in each case as a function of the coating to be carried out.

The device will be described in more detail with reference to an exemplary embodiment. The associated drawing shows a section through a device for coating sliding elements. In a temperature-control chamber 1 there is arranged a device for controlling the temperature of support members 2, in which the plain bearings 3 to be coated are form-fittingly secured. Temperature-control elements are pressed against the support members 2. The temperature of the support members 2 is thus adjusted to 90° C. An air-lock chamber 5 adjoins the temperature-control chamber 1 via a vacuum valve 4. All the vacuum chambers are likewise separated from each other by vacuum valves 4. The air-lock chambers 5 serve to transfer the support members 2 from the atmosphere into the vacuum. The support members 2 may be moved on a conveying track 6 for the purpose of passage through the device. The drive means is incorporated into each support member 2. A pre-treatment chamber 7 adjoins the air-lock chamber 5. In this there is arranged a magnetic field-supported etching means 8 for pre-treatment of the plain bearings 3 arranged in the support members 2 by means of a high-intensity plasma. This plasma is guided through a specially formed magnetic field which operates according to the magnetron principle. The etching device 8 is so designed that the support members 8 carrying the plain bearings 3 and the conveying track 6 are at earth potential. The temperature-controlled support members 2 are then conveyed further into a first coating chamber 9. Arranged therein, at a distance conformed to the geometry of the plain bearings 3, is a magnetron 10 with a sputtering target of NiCr. An NiCr layer is atomised onto the plain bearings 3 in this first coating chamber 9. Movement of the support members 2 through this coating chamber 9 is discontinuous. Thereafter, the support members 2 arrive at a second coating chamber 11, residing initially in a first buffer zone 12. This buffer zone 12 serves to adapt the different conveying profile of the first coating chamber to that of the second coating chamber 11 and to adapt the different operating pressures. While the support members 2 are moved discontinuously over the magnetron 10, movement of the support members 2 through the coating area 13 of the second coating chamber 11 is continuous. A plurality of support members 2 are located in the buffer zone 12. A conveying control program ensures that the discontinuous succession of support members 2 is converted into a continuous succession of support members 2 and that operation of the vaporiser may be continuous, i.e. through this area several rows of support members 2 may move in succession over the vaporiser. The continuous succession of support members 2 is then reconverted via the buffer zone 18 into a succession of support members 2 which may be conveyed and passed through air-locks in discontinuous manner. An electron beam vaporiser is arranged in the coating area 13. This consists of an axial electron gun 14, the electron beam 15 from which is directed in known way by a magnetic field onto vaporisation material 17 located in a vaporiser crucible 16. An AlSn alloy may be used as the vaporisation material and may be fed from a magazine 17 in strand form through the base of the vaporiser crucible. As the plain bearings 3 move over the electron beam vaporiser, they have a second layer, an overlay, applied to them. The support members 2 leave the device via the above-described buffer zone 18 and a further air-lock chamber 19, and the finally coated plain bearings 3 are removed from the support members 2 in the discharge area 20.

What is claimed is:

1. A device for vacuum coating plain bearings, comprising:

a plurality of vacuum chambers arranged in succession and including an air-lock chamber at an inlet side of the device, a pretreatment chamber following said air-lock chamber in a direction of travel of plain bearings through said device, a first coating chamber following said pretreatment chamber in said direction, a second coating chamber following said first coating chamber in said direction, and an air-lock chamber at an outlet side of the device following said second coating chamber in said direction;

vacuum pump and control means for evacuating said chambers and enabling the transfer of plain bearings in succession from said airlock chamber at said inlet side of the device through said pretreatment chamber, said first coating chamber, said second coating chamber and the airlock chamber at said outlet side of said device;

a conveyer for transporting said plain bearings through said chambers and including a conveying track and a plurality of support members shaped to form fittingly receive said plain bearings so that said plain bearings can be pressed into said support members with adjustable force;

a temperature control for said support members;

a control device for controlling movement of said support members through the respective pretreatment, first coating and second coating chambers for controlling the treatment process to be carried out therein;

an etcher in said pretreatment chamber for stationary magnetic field plasma etching of the plain bearings therein;

a magnetron sputtering source having at least one target and located in said first coating chamber below the plain bearings;

an electronic beam vaporizer having a vaporizer crucible in said second coating chamber for electron beam vaporization coating of the plain bearings; and buffer zones upstream and downstream of said electron beam vaporizer.

2. The device defined in claim 1 wherein a plurality of said plain bearings are arranged next to one another in at least one row in a respective support member so that apices of the plain bearings form a line.

3. The device defined in claim 1 wherein rows of said plain bearings in a respective support member are arranged longitudinally of said direction.

4. The device defined in claim 1 wherein rows of said plain bearings in a respective support member are arranged transversely of said direction.

5. The device defined in claim 1 wherein each support member comprises two parts, one of said parts being connected with said track and the other of said parts being shaped to accommodate said plain bearings and being provided for temperature control thereof.

6. The device defined in claim 5 wherein the other of said parts is replaceable on said one of said parts.

7. The device defined in claim 5 wherein said other of said parts has high heat conductivity and a high specific heat capacity.

8. The device defined in claim 7 wherein said other of said parts is composed of copper.

9. The device defined in claim 4 wherein said electron beam vaporizer has an axial electron gun laterally of said vaporizer crucible.

10. The device defined in claim 1 wherein said vaporizer crucible has an opening in a base thereof for feeding material to be vaporized to said crucible.

11. The device defined in claim 1 wherein said buffer zones are arranged in said second coating chamber.

12. The device defined in claim 1 wherein said buffer zones are provided in separate vacuum chambers.

13. The device defined in claim 1, further comprising a return for said support members from the air lock chamber at said outlet side to said airlock chamber at said inlet side.

14. The device defined in claim 1 wherein said vacuum chambers are arrayed in a line and said support members are conveyed through said chambers linearly.

15. The device defined in claim 1 wherein said vacuum chambers arranged in a ring.

16. The device defined in claim 1 wherein said etcher is so constructed and arranged that said support members are at ground potential and the magnetic field forms a tunnel.

* * * * *